United States Patent
Ogawa et al.

(10) Patent No.: US 11,190,193 B2
(45) Date of Patent: Nov. 30, 2021

(54) SEMICONDUCTOR DEVICE

(71) Applicant: LAPIS Semiconductor Co., Ltd., Yokohama (JP)

(72) Inventors: Junya Ogawa, Yokohama (JP); Katsuaki Matsui, Yokohama (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/825,769

(22) Filed: Mar. 20, 2020

(65) Prior Publication Data

US 2020/0313679 A1 Oct. 1, 2020

(30) Foreign Application Priority Data

Mar. 26, 2019 (JP) .............................. JP2019-059399

(51) Int. Cl.
*H03L 7/087* (2006.01)
*H03L 7/097* (2006.01)
*H04L 7/033* (2006.01)
*H03L 7/06* (2006.01)

(52) U.S. Cl.
CPC ................ *H03L 7/087* (2013.01); *H03L 7/06* (2013.01); *H03L 7/097* (2013.01); *H04L 7/033* (2013.01)

(58) Field of Classification Search
CPC ............ H03L 7/06; H03L 7/097; H03L 7/033
See application file for complete search history.

(56) References Cited

U.S. PATENT DOCUMENTS 3,531,777 A * 9/1970 West .......................... H04L 7/00
710/61
4,604,582 A * 8/1986 Strenkowski ......... H04L 7/0037
327/147
4,850,473 A * 7/1989 MacWilliams .... B65G 47/5109
198/463.6

(Continued)

FOREIGN PATENT DOCUMENTS

CN 104242904 A * 12/2014 ............. G09G 5/006
CN 105223555 A * 1/2016
(Continued)

OTHER PUBLICATIONS

JP09181593—Digital Output Stage Circuit (Japanese Language) (Year: 1997).*
(Continued)

*Primary Examiner* — Berhanu Tadese
(74) *Attorney, Agent, or Firm* — Rabin & Berdo, P.C.

(57) ABSTRACT

A semiconductor device outputs, as an output signal synchronized to a phase-locked loop clock signal, a synchronized input signal that is synchronized to a reference clock signal of a phase-locked loop circuit. The semiconductor device includes the phase-locked loop circuit, a first flip-flop that receives the input signal in synchronization with the reference clock signal on the basis of a feedback signal inputted to a phase comparator of the phase-locked loop circuit 10, and a second flip-flop that receives an output from the first flip-flop on the basis of the phase-locked loop clock signal. The second flip-flop outputs the output from the first flip-flop as the output signal. A setup time to synchronize the input signal to the phase-locked loop clock signal is set to one half of a period of the reference clock signal.

5 Claims, 3 Drawing Sheets

(56) References Cited

U.S. PATENT DOCUMENTS

| | | | | |
|---|---|---|---|---|
| 5,191,295 A * | 3/1993 | Necoechea | G01R 31/2846 | 327/158 |
| 5,349,612 A * | 9/1994 | Guo | H03K 5/135 | 327/270 |
| 5,546,434 A * | 8/1996 | Kalafatis | H03L 7/085 | 331/1 A |
| 5,563,872 A * | 10/1996 | Horimai | G11B 7/0045 | 369/275.4 |
| 6,002,279 A * | 12/1999 | Evans | H04L 7/033 | 327/144 |
| 6,061,314 A * | 5/2000 | Arai | G11B 19/12 | 369/47.41 |
| 6,285,225 B1 * | 9/2001 | Chu | H03L 7/0816 | 327/158 |
| 6,329,850 B1 * | 12/2001 | Mair | G06F 1/025 | 327/105 |
| 6,424,688 B1 * | 7/2002 | Tan | G06F 1/12 | 375/354 |
| 6,760,392 B1 * | 7/2004 | Tan | H04L 7/02 | 375/354 |
| 6,959,063 B1 * | 10/2005 | Nilsson | H03D 13/004 | 375/371 |
| 7,034,591 B2 * | 4/2006 | Wang | H03L 7/0891 | 327/158 |
| 7,053,719 B2 * | 5/2006 | Steinbach | H03L 7/099 | 331/16 |
| 7,088,155 B2 * | 8/2006 | Takahashi | H03L 7/07 | 327/144 |
| 7,287,105 B1 * | 10/2007 | Owen | G06F 1/12 | 365/189.08 |
| 7,302,026 B2 * | 11/2007 | Kaeriyama | H03L 7/083 | 375/355 |
| 7,323,940 B2 * | 1/2008 | Mar | H03L 7/095 | 331/1 A |
| 7,684,531 B2 * | 3/2010 | Masui | H04L 7/0338 | 375/355 |
| 7,826,583 B2 * | 11/2010 | Jeong | H03D 13/004 | 375/376 |
| 8,502,581 B1 * | 8/2013 | Opris | H03L 7/0995 | 327/159 |
| 8,804,887 B2 * | 8/2014 | Uehara | H04L 7/0337 | 375/354 |
| 8,952,736 B1 * | 2/2015 | Evans | H03L 7/16 | 327/156 |
| 2003/0214495 A1 * | 11/2003 | Koyama | G09G 5/006 | 345/204 |
| 2004/0086002 A1 * | 5/2004 | Dally | H03L 7/0816 | 370/539 |
| 2004/0114632 A1 * | 6/2004 | Yuuki | H04L 7/0331 | 370/503 |
| 2004/0165505 A1 * | 8/2004 | Gushima | G11B 7/1263 | 369/59.11 |
| 2005/0242850 A1 * | 11/2005 | Kawasaki | H03L 7/08 | 327/155 |
| 2006/0109943 A1 * | 5/2006 | Nguyen | G06F 1/10 | 713/600 |
| 2009/0041173 A1 * | 2/2009 | Lin | H03D 13/003 | 375/374 |
| 2009/0110136 A1 * | 4/2009 | Badalone | H03D 13/004 | 375/376 |
| 2009/0135885 A1 * | 5/2009 | Lin | H04B 1/69 | 375/130 |
| 2009/0256601 A1 * | 10/2009 | Zhang | H03L 7/1976 | 327/156 |
| 2011/0022934 A1 * | 1/2011 | Oh | G06F 1/10 | 714/798 |
| 2012/0200330 A1 * | 8/2012 | Kawagoe | H03K 5/133 | 327/161 |
| 2012/0212290 A1 * | 8/2012 | Hafuka | H04L 27/14 | 329/303 |
| 2013/0251077 A1 * | 9/2013 | Hasegawa | H03G 3/3078 | 375/345 |
| 2014/0118040 A1 * | 5/2014 | Nakayama | H03L 7/0816 | 327/157 |
| 2015/0280901 A1 * | 10/2015 | Hafuka | H03L 7/081 | 375/355 |
| 2016/0142066 A1 * | 5/2016 | Balasubramanian | G06F 1/08 | 327/115 |
| 2016/0142067 A1 * | 5/2016 | Balasubramanian | G06F 1/08 | 327/115 |
| 2016/0254818 A1 * | 9/2016 | Luo | H03L 7/089 | 327/159 |
| 2016/0285442 A1 * | 9/2016 | Nitawaki | H03L 7/00 | |
| 2016/0308541 A1 * | 10/2016 | Liu | H03L 7/089 | |
| 2017/0318234 A1 * | 11/2017 | Maeda | H04N 5/04 | |
| 2018/0241539 A1 * | 8/2018 | Uehara | H04L 7/0012 | |
| 2020/0313679 A1 * | 10/2020 | Ogawa | H04L 7/033 | |

FOREIGN PATENT DOCUMENTS

| | | | | |
|---|---|---|---|---|
| CN | 105223555 B | * | 12/2017 | H03L 7/097 |
| EP | 1246368 | * | 2/2002 | H04N 5/126 |
| EP | 1246368 A2 | * | 10/2002 | H03L 7/081 |
| EP | 1562294 A1 | * | 8/2005 | H03L 7/1974 |
| JP | 09181593 | * | 7/1997 | H03K 19/003 |
| JP | 09181593 A | * | 7/1997 | H03L 7/097 |
| JP | H09-181593 A | | 7/1997 | |
| JP | 2018074231 A | * | 5/2018 | H03L 7/097 |
| JP | 2018170721 A | * | 11/2018 | G06K 19/0723 |

OTHER PUBLICATIONS

JP09181593—Digital Output Stage Circuit (Machine Translated) (Year: 1997).*

EP1246368—Semiconductor device that generates a clock which is synchronized with a reference signal includes N stages of Flip-flops (Year: 2002).*

* cited by examiner

SEMICONDUCTOR DEVICE

TECHNICAL FIELD

The present invention relates to a semiconductor device, and in particular, to a semiconductor including a signal synchronization circuit provided with a phase-locked loop (PLL) circuit.

BACKGROUND ART

An example of a document pertaining to a signal synchronization circuit provided with a PLL circuit of a conventional technique is Japanese Patent Application Laid-Open Publication No. H9-181593, for example. Japanese Patent Application Laid-Open Publication No. H9-181593 discloses a digital output stage circuit characterized by including: a first synchronization circuit that is provided for each of a plurality of pieces of bit data, and that synchronizes the bit data to a system clock signal; a PLL circuit that is constituted of at least a plurality of voltage control delay stages, and that receives the system clock signal as input; a second synchronization circuit that synchronizes the outputs from the first synchronization circuit with the outputs from the plurality of voltage control delay stages of the PLL circuit as prescribed clock signals; and a drive circuit that drives the output signals of the second synchronization circuit.

Signal synchronization circuits of the conventional technique typically have a configuration whereby, in order to synchronize a signal that was synchronized to the clock signal of one system to the clock signal of another system, signals outputted from flip-flops controlled by the clock signal of the one system are received by flip-flops controlled by the clock signal of the other system. In such a case, in order to ensure a setup time and hold time for the flip-flops of the other system, a delay element was sometimes interposed between the flip-flops of the one system and the flip-flops of the other system in consideration of the delay between the flip-flops of the one system and the flip-flops of the other system, as well as clock skew between the two systems.

SUMMARY OF THE INVENTION

However, the configuration of the signal synchronization circuit of the conventional technique presents the problem that it is difficult to know in a quantitative sense the manufacturing variation between two systems at the design stage, and if the manufacturing variation is large at the mass production stage, then there are cases in which there is an anomaly in device inspection during manufacturing. Japanese Patent Application Laid-Open Publication No. H9-181593 does not account for such a problem.

The present invention takes into consideration the above-mentioned problem, and an object thereof is to provide a semiconductor device that includes a signal synchronization circuit that conducts signals between circuits under differing clock synchronization systems, by which a decrease in operational tolerance is mitigated.

A semiconductor device according to the present invention is configured to output, as an output signal synchronized to a phase-locked loop clock signal, an input signal synchronized to a reference clock signal of a phase-locked loop circuit, the semiconductor device including: a first flip-flop that is configured to receive the input signal in synchronization with the reference clock signal on the basis of a feedback signal inputted to a phase comparator of the phase-locked loop circuit; and a second flip-flop that is configured to receive output from the first flip-flop on the basis of the phase-locked loop clock signal, and to output the output from the first flip-flop as the output signal, wherein a setup time when synchronizing to the phase-locked loop clock signal is set to one half of a period of the reference clock signal.

According to the present invention, it is possible to provide a semiconductor device that includes a signal synchronization circuit that conducts signals between circuits under differing clock synchronization systems, by which a decrease in operational tolerance is mitigated.

DETAILED DESCRIPTION OF EMBODIMENTS

Below, an embodiment of the present invention will be described in detail with reference to the drawings. In the embodiment below, a signal synchronization circuit including a PLL circuit is described as an example of a semiconductor device according to the present invention.

Figure 1:
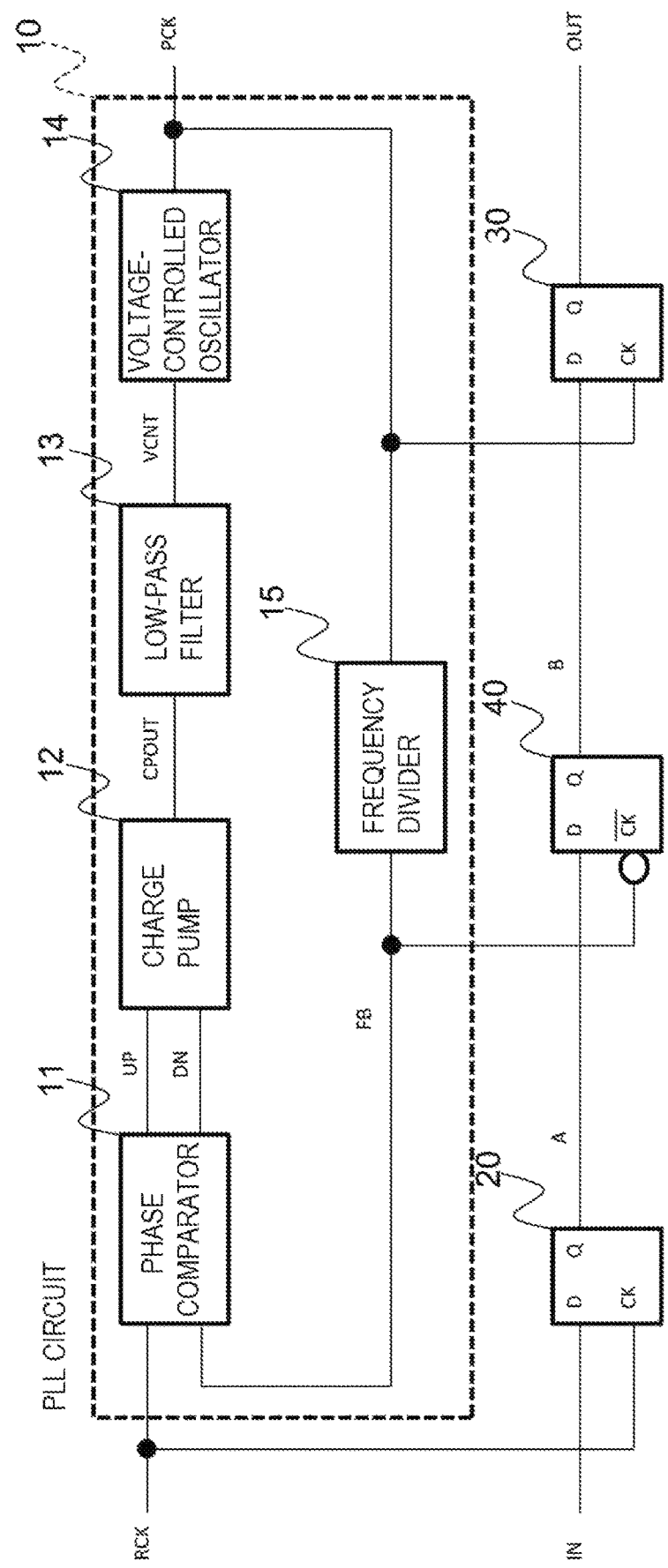
FIG. 1 is a block diagram showing an example of a configuration of a semiconductor device according to an embodiment.

FIG. 1 shows a semiconductor device 1 (signal synchronization circuit) according to the present embodiment. As shown in FIG. 1, the semiconductor device 1 includes a PLL circuit 10 and flip-flops 20, 30, and 40.

The PLL circuit 10 is constituted of a phase comparator 11, a charge pump 12, a low-pass filter 13, a voltage-controlled oscillator 14, and a frequency divider 15. The phase comparator 11 determines the phase difference by comparison between a reference clock signal RCK and a feedback signal FB that has been fed back from the voltage-controlled oscillator 14 through the frequency divider 15 (that is a frequency division signal attained by frequency-dividing a PLL clock signal PCK that is an output clock signal). The PLL circuit 10 adjusts the frequency of the output signal from the voltage-controlled oscillator 14 on the basis of the phase difference detected by the phase comparator 11.

More specifically, the phase comparator 11 generates charge signals UP and DN for the charge pump 12 according to the phase difference between the reference clock signal RCK and the feedback signal FB. The charge signal UP is a signal for charging the charge pump, and the charge signal DN is a signal for discharging from the charge pump. The charge pump 12 outputs an output signal CPOUT on the basis of the inputted charge signals UP and DN. The low-pass filter 13 eliminates high frequency components from the output signal CPOUT, and outputs a control signal (voltage signal) VCNT for the voltage-controlled oscillator 14. The voltage-controlled oscillator 14 generates a PLL clock signal (phase-locked loop clock signal) PCK for which the frequency is controlled on the basis of the control signal VCNT.

Figure 3:
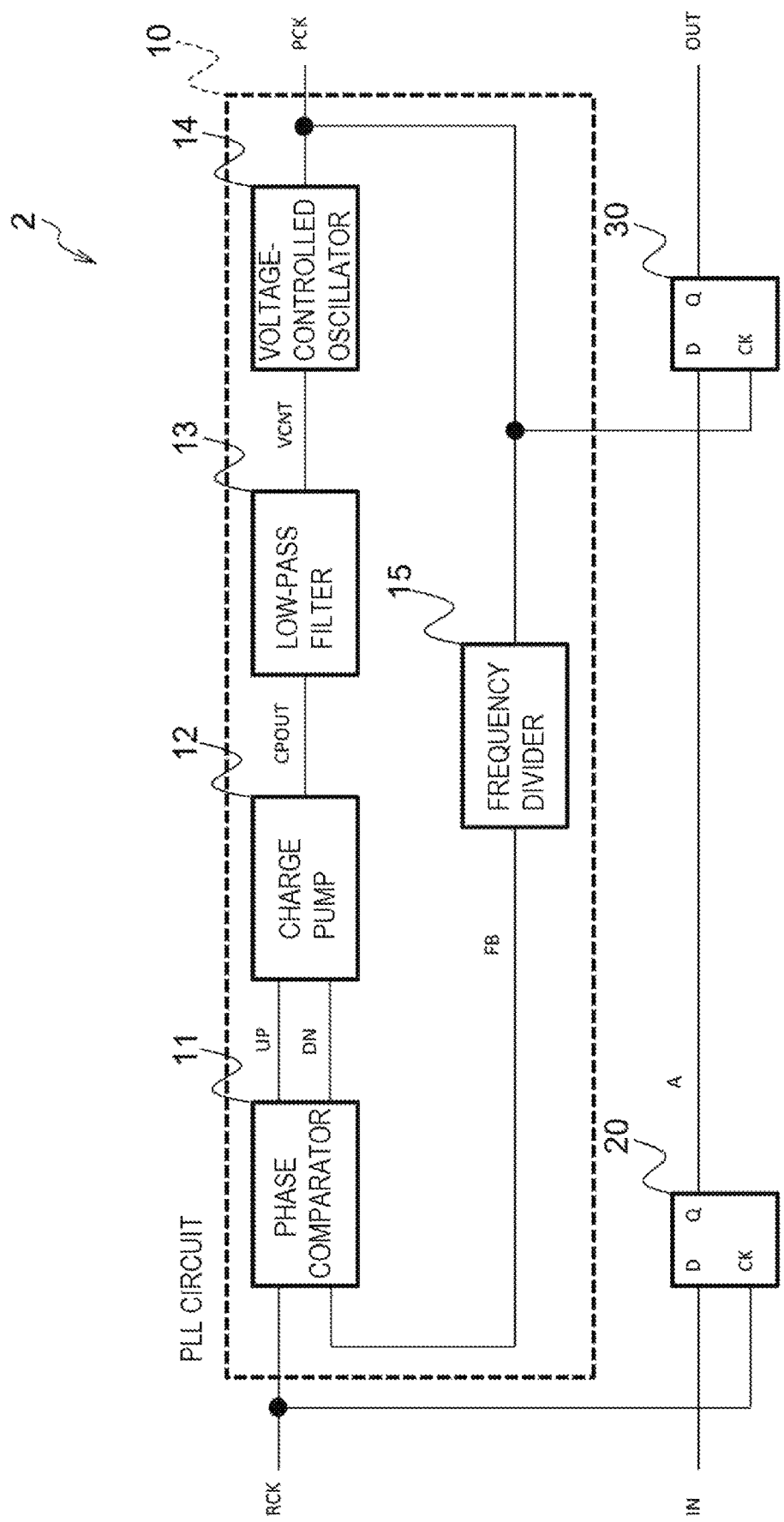
FIG. 3 is a block diagram showing a configuration of a semiconductor device according to a comparison example.

For comparison with the semiconductor device 1, a semiconductor device 2 of a comparison example will be described with reference to FIG. 3. As shown in FIG. 3, the semiconductor device 2 includes a PLL circuit 10 and flip-flops 20 and 30. The PLL circuit 10 is the same as the above-mentioned PLL circuit 10. That is, for example, the voltage-controlled oscillator 14 receives the control signal VCNT adjusted on the basis of the phase difference detected by the phase comparator 11, and generates the PLL clock signal PCK having a frequency based on the control signal VCNT. The flip-flop 20 receives an input signal IN at the rising edge of the reference clock signal RCK. The flip-flop 30 receives an output signal A from the flip-flop 20 at the rising edge of the PLL clock signal PCK, and outputs the output signal OUT. By the above operation, conversion of the synchronized clock signal (clock signal handoff) from the reference clock signal RCK to the PLL clock signal PCK is performed on the input signal IN.

By contrast to the semiconductor device 2, the semiconductor device 1 has the addition of the flip-flop 40 as shown in FIG. 1. Similar to the semiconductor device 2, in the semiconductor device 1 as well, the flip-flop 20 receives an input signal IN at the rising edge of the reference clock signal RCK. The flip-flop 40 receives an output signal A from the flip-flop 20 at the falling edge of the feedback signal FB. The flip-flop 30 receives an output signal B from the flip-flop 40 at the rising edge of the PLL clock signal PCK, and outputs the output signal B as the output signal OUT.

The operation of the semiconductor device 1 will be described in further detail here. The flip-flop 20 receives the input signal IN at the rising edge of the reference clock signal RCK in a state in which the PLL circuit 10 is locked, or in other words, the frequency of the reference clock signal RCK is the same as the frequency of the feedback signal FB. The output signal A from the flip-flop 20 is received by the flip-flop 40 at the falling edge of the feedback signal FB.

The feedback signal FB is a clock signal of a differing system than the reference clock signal RCK, but in a state where the PLL circuit 10 is locked, the reference clock signal RCK can be considered to be equal to the feedback signal FB (that is, the reference clock signal RCK and the feedback signal FB can be considered to be clock signals of the same system). Thus, the setup time for the flip-flop 40, which receives the signal at the falling edge of the feedback signal FB, is T/2, where T is the frequency of the reference clock signal RCK. The output signal B from the flip-flop 40 is received by the flip-flop 30 at the rising edge of the PLL clock signal PCK, which is a clock signal in the same system as the feedback signal FB, and outputs the output signal B as the output signal OUT. By the above operation, conversion of the synchronized clock signal (clock signal handoff) from the reference clock signal RCK to the PLL clock signal PCK is performed on the input signal IN in the semiconductor device 1.

Figure 2:
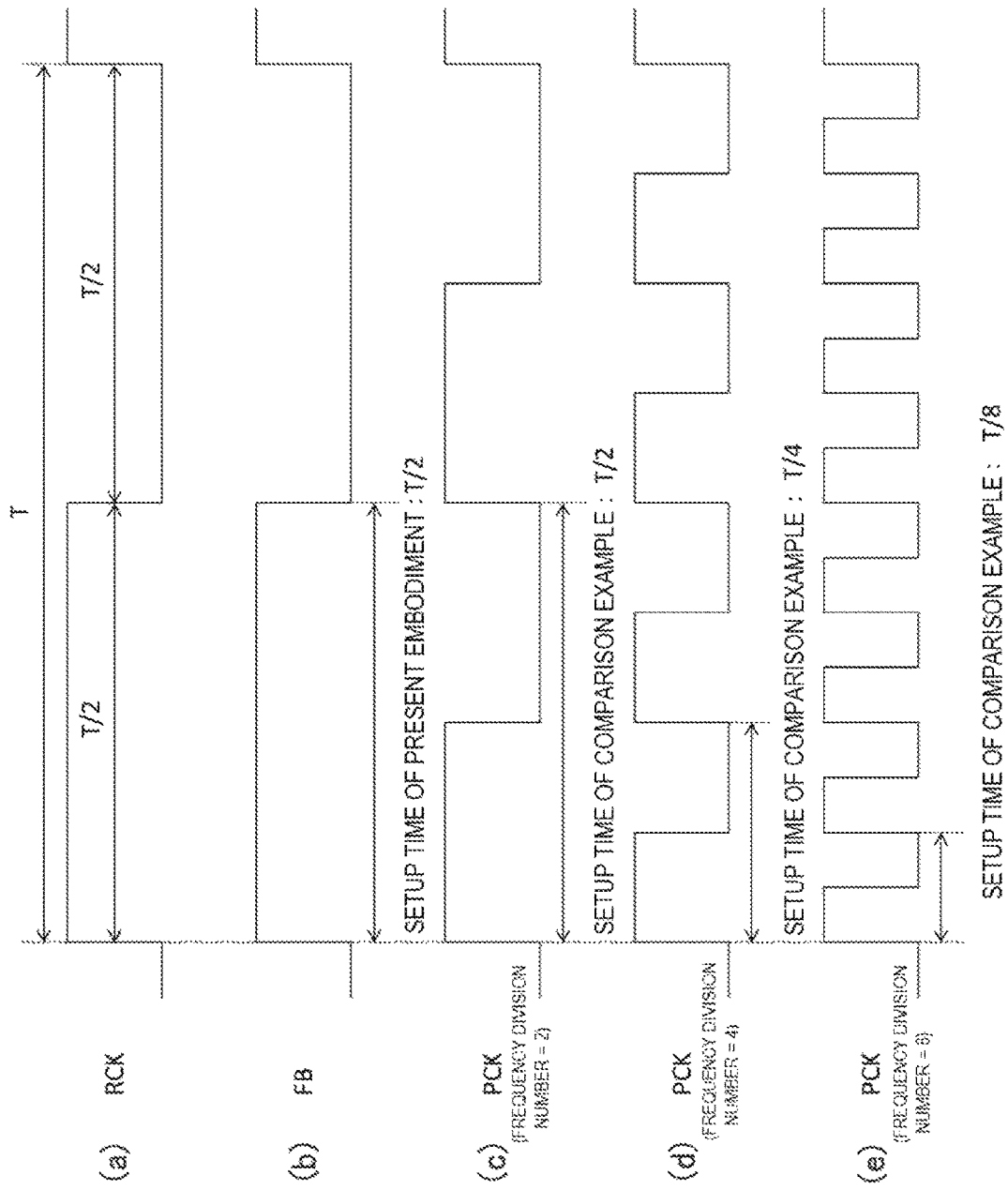
FIG. 2 is a timing chart showing the operation of each component of the semiconductor device according to the embodiment.

FIG. 2 shows the setup time of the semiconductor device 1 of the present embodiment in comparison with the setup time of the semiconductor device 2 of the comparison example in FIG. 3. In FIG. 2, (a) is a waveform of the reference clock signal RCK, (b) is a waveform of the feedback signal FB, (c) is a waveform of the PLL clock signal PCK where the frequency division number of the frequency divider 15 is 2, (d) is a waveform of the PLL clock signal PCK where the frequency division number of the frequency divider 15 is 4, and (e) is a waveform of the PLL clock signal PCK where the frequency division number of the frequency divider 15 is 8.

As described above, the setup time in the semiconductor device 1, that is, the setup time when synchronizing the input signal IN, is determined according to the setup time of the flip-flop 40. The clock signal inputted to the flip-flop 40 is the feedback signal FB, and thus, as shown in (b) of FIG. 2, the setup time for synchronizing the input signal IN in the semiconductor device 1 is T/2.

On the other hand, the setup time for the semiconductor device 2 is determined according to the setup time of the flip-flop 30. The clock signal inputted to the flip-flop 30 is the PLL clock signal PCK, and thus, where the frequency division number of the frequency divider 15 is 2, 4, or 8, the setup time for the semiconductor device 2 is respectively T/2, T/4, or T/8. By contrast, the setup time for the semiconductor device 1 of the present embodiment is T/2 regardless of the frequency division number.

As described in detail above, the semiconductor device of the present embodiment is provided with a flip-flop 40 that receives, at the falling edge of a feedback signal FB of a PLL circuit 10, the output from a flip-flop that receives a signal in synchronization with a clock signal of a differing system, and thus, this semiconductor device exhibits the effect that regardless of the frequency division number of the frequency divider 15, the setup time of the flip-flop to be synchronized is set to T/2, where T is the frequency of the clock signal of a different system (that is, the reference clock signal RCK). Additionally, the semiconductor device exhibits the effect that the output from the flip-flop 40 can be received in synchronization with the PLL clock signal PCK, which is a clock signal of the same system.

What is claimed is:

1. A semiconductor device that is configured to output, as an output signal synchronized to a phase-locked loop clock signal, a synchronized input signal having been synchronized to a reference clock signal of a phase-locked loop circuit, the semiconductor device comprising:
   the phase-locked loop circuit configured to receive as an input signal the reference clock signal;
   a first flip-flop that is configured to receive at a first data input terminal an input signal in synchronization with the reference clock signal and at a first clock terminal a feedback signal inputted to a phase comparator of the phase-locked loop circuit;
   a second flip-flop having a second data input terminal connected to a first output terminal of the first flip-flop; and
   a third flip-flop configured to latch an external input signal and to output the latched external input signal to the first flip-flop in synchronization with the reference clock signal,
   wherein the phase-locked loop circuit, the first flip-flop, and the second flip-flop are configured such that a setup time to synchronize the input signal to the phase-locked loop clock signal is set to one half of a period of the reference clock signal.

2. A semiconductor device that is configured to output, as an output signal synchronized to a phase-locked loop clock signal, a synchronized input signal having been synchronized to a reference clock signal of a phase-locked loop circuit, the semiconductor device comprising:
   the phase-locked loop circuit configured to receive as an input signal the reference clock signal;
   a first flip-flop that is configured to receive at a first data input terminal an input signal in synchronization with the reference clock signal and at a first clock terminal a feedback signal inputted to a phase comparator of the phase-locked loop circuit; and
   a second flip-flop having a second data input terminal connected to a first output terminal of the first flip-flop, wherein the phase-locked loop circuit, the first flip-flop, and the second flip-flop are configured such that a setup time to synchronize the input signal to the phase-locked loop clock signal is set to one half of a period of the reference clock signal, wherein the first flip-flop latches the input signal at a falling edge of the feedback signal, wherein the second flip-flop latches the output from the first flip-flop at a rising edge of the phase-locked loop clock signal, and wherein the setup time to synchronize the input signal to the phase-locked loop clock signal is a setup time of the first flip-flop.

3. The semiconductor device according to claim 1, wherein the phase-locked loop circuit comprises:

the phase comparator configured to compare a phase of the reference clock signal to a phase of the feedback signal;

a voltage-controlled oscillator configured to output the phase-locked loop clock signal for which a frequency is controlled on the basis of an output from the phase comparator; and a frequency divider configured to frequency-divide the phase-locked loop clock signal to generate the feedback signal.

4. The semiconductor device according to claim 1, wherein the third flip-flop is configured to latch the external input signal at a rising edge of the reference clock signal.

5. A semiconductor device, comprising:

a phase-locked loop circuit configured to receive as input a first clock signal and output a second clock signal, and that is configured to frequency-divide the second clock signal to generate a feedback signal;

a first flip-flop that is configured to receive as input a first signal synchronized to the first clock signal on the basis of the feedback signal, and to output a second signal;

a second flip-flop that is configured to receive as input the second signal on the basis of the second clock signal, and to output the output signal; and a third flip-flop configured to latch an external input signal and to output the latched external input signal to the first flip-flop in synchronization with the first clock signal, wherein the phase-locked loop circuit, the first flip-flop, and the second flip-flop are configured such that a setup time to synchronize the first clock signal to the second clock signal is set to one half of a period of the first clock signal.

* * * * *